A method for fabricating a memory device is provided: A multi-layer stack is formed on a substrate. The multi-layer stack is then patterned to form plural trenches extending along a first direction to define plural ridge-shaped stacks each of which comprises at least one conductive strip. Next, a memory layer and a channel layer are formed in sequence on bottoms and sidewalls of the trenches. A sacrifice layer is formed to fulfill the trenches. Subsequently, portions of the sacrifice layer, the memory layer and the channel layer formed in the trenches are removed to form plural openings exposing a portion of the substrate therefrom. After removing the remaining sacrifice layer, portions of the memory layer and the channel layer formed on the ridge-shaped stacks are patterned to form an interconnection between two adjacent trenches through two of the openings formed in the two adjacent trenches.

11 Claims, 12 Drawing Sheets

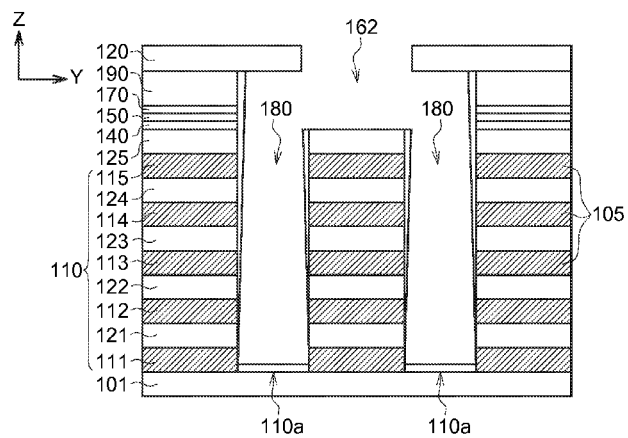

(56) References Cited

U.S. PATENT DOCUMENTS

| | | | | |
|---|---|---|---|---|
| 2012/0267702 | A1* | 10/2012 | Jee | H01L 27/11582 257/324 |
| 2013/0178030 | A1* | 7/2013 | Ramkumar | H01L 21/823431 438/287 |
| 2013/0323930 | A1* | 12/2013 | Chattopadhyay | H01L 21/02107 438/703 |
| 2015/0200199 | A1* | 7/2015 | Sakamoto | H01L 27/11556 257/329 |

OTHER PUBLICATIONS

Daamen, et al. :Production of 150nm wide Air Gap Interconnects with a "Sacrificial Materials Approach" and a "Close-off Approach"; Koninklijke Philips Electronics N.V. 2005; pp. 1-24.

* cited by examiner

METHOD FOR FABRICATING MEMORY DEVICE

BACKGROUND

1. Technical Field

The disclosure in generally relates to a method for fabricating a semiconductor device, and more particularly to a method for fabricating a memory device.

2. Description of the Related Art

Non-volatile memory (NVM) which is able to continually store information even when the supply of electricity is removed from the device containing the NVM cell has been widely adopted by bulk solid state memory applications in portable audiovisual entertainment devices, cell phones or digital cameras etc. Recently, various three dimensional (3D) memory devices, such as a 3D single gate vertical-channel (SGVC) flash memory device that has a multi-layer stack structure may possess a higher density memory and excellent electrical characteristics, e.g. reliability in data storage and high operating speed, has been provided in order to accommodate the rising demand for superior memory.

However, as semiconductor features shrink in size and pitch, the problems of degradation in electrical properties and device operation due to inter-cell interference between adjacent memory cells is getting worse. In order to solve the problems, air gaps disposed between gates of two adjacent memory cells are applied to reduce cell-to-cell interference.

A typical method for fabricating a 3D SGVC flash memory device with air gaps comprises steps as follows: A plurality of word line trenches are formed in a multi-layer stack, and a memory layer and a channel layer are formed in sequence on the bottoms and sidewalls of the word line trenches, such that a plurality of gaps are formed between the channel layer conformal to the vertical sidewalls of the word line trenches. Next, a plurality of bit line openings are formed to remove portions of the memory layer and the channel layer that are disposed in the word line trenches, so as to define a plurality memory cells connected in series and disposed on the vertical sidewalls of the word line trenches. Since the etching gas used to form the bit line openings may flow along the gaps, thus the word line trenches may be permeated with the etching gas and the portions of memory layer and the channel layer that are disposed in the word line trenches used to form the memory cells may be damaged. As a result, the pattern of the bit line openings may be misaligned and device failure of the 3D SGVC flash memory may occur.

Therefore, there is a need of providing an improved method for fabricating a memory device to obviate the drawbacks encountered from the prior art.

SUMMARY

One aspect of the present invention is to provide a method for fabricating a memory device, wherein the method comprises steps as follows: Firstly, A multi-layer stack is formed on a substrate. The multi-layer stack is then patterned to form a plurality of trenches extending along a first direction, so as to define a plurality of ridge-shaped stacks each of which comprises at least one conductive strip. Next, a memory layer and a channel layer are formed in sequence on bottoms and sidewalls of the trenches. A sacrifice layer is formed to fulfill the trenches. Subsequently, portions of the sacrifice layer, the memory layer and the channel layer formed in the trenches are removed to form a plurality of openings exposing a portion of the substrate therefrom. Thereafter, the remaining sacrifice layer is removed to form a plurality of air gaps in the trenches. Subsequently, portions of the memory layer and the channel layer disposed on the ridge-shaped stacks are patterned to form an interconnection interconnecting two adjacent trenches through two of the openings formed in the two adjacent trenches.

In accordance with the aforementioned embodiments of the present invention, a method for fabricating a memory device is provided. A plurality of trenches are formed in a multi-layers stack to define a plurality of ridge-shaped stacks each of which comprises at least one conductive strip. A memory layer and a channel layer are formed sequentially on bottoms and sidewalls of the trenches, and a sacrifice layer is then formed to fulfill the gaps formed in the trenches. Portions of the memory layer and the channel layer that are disposed in the trenches are removed to form a plurality of openings in the trench and define a plurality of memory cells connected in series and disposed on the vertical sidewalls of the trenches.

Since the gaps formed in the trenches are fulfilled by the sacrifice layer prior the forming of the openings, thus the etching gas used to form the opening cannot flow along the gaps and damage the portions of the memory layer and the channel layer that are disposed in the trenches. As a result, the prior art problems of misaligned bit line openings and device failure of the 3D SGVC flash memory due to the damages of the memory layer and the channel layer caused by overflow of the etching gas may be avoided.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1:
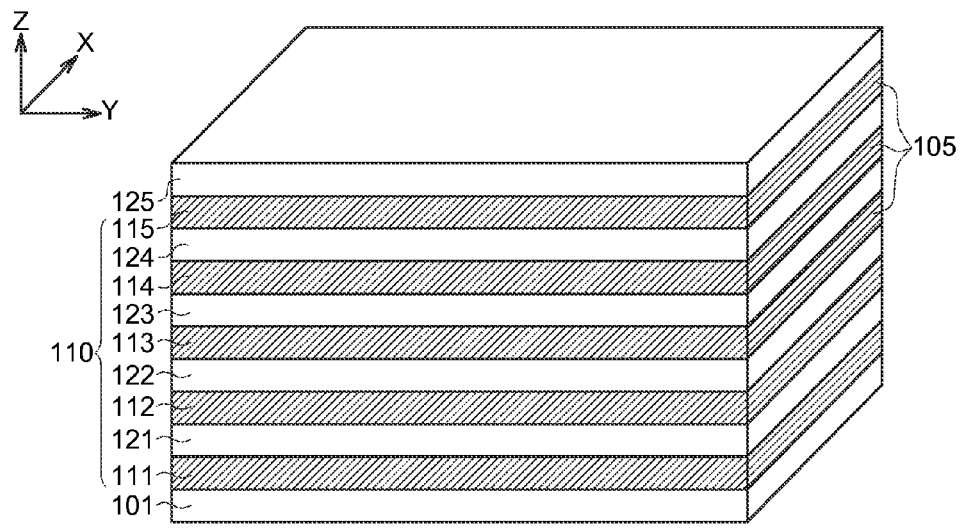
FIG. 1 is a prospective view illustrating a multi-layer stack in accordance with one embodiment of the present invention.

The embodiments as illustrated below provide a method for fabricating a memory device to solve the problems of misaligned bit line openings and device failure of a memory device due to the damages of the memory layer and the channel layer caused by overflow of the etching gas. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

The method for fabricating a 3D memory device 100 comprises several steps as follows: Firstly, a multi-layer stack 110 is formed on a substrate 101. FIG. 1 is a prospective view illustrating the multi-layer stack 110 in accordance with one embodiment of the present invention. In some embodiments of the present invention, the multi-layer stack 110 is formed on a semiconductor substrate 101. The multi-layer stack 110 comprises a plurality of conductive layers 111-115, and a plurality of insulating layers 121-125. In the present embodiment, the insulating layers 121-125 are alternately stacked with the conductive layer 111-115 on the substrate 101 along a Z-direction as illustrated in FIG. 1A. As a result, the conductive layer 111 is disposed at the bottom of the multi-layer stack 110, and the insulating layer 125 is disposed at the top of the multi-layer stack 110.

The conductive layers 111-115 can be formed of a conductive semiconductor material, such as n-type poly-silicon, or n-type epitaxial single crystal silicon, doped with phosphorus or arsenic. Alternatively, the conductive layers 111-115 can be formed of p-type poly-silicon, or p-type epitaxial single crystal silicon, doped with boron. Still alternatively, the conductive layers 111-115 can be formed of un-doped semiconductor material, such as un-doped poly-silicon. In the present embodiment, the conductive layers 111-115 are preferably formed of P+ poly-silicon. The reason is that P+ poly-silicon could gain lower erased voltage due to less electron injection from P+ poly-silicon.

The insulating layers 121-125 can be formed of a dielectric material such as silicon oxide, silicon nitride, silicon oxynitride, silicate, or others. The thickness of each one of the insulating layers 121-125 can be about 20 nm to 40 nm. In some embodiments of the present invention, the conductive layers 111-115 and the insulating layers 121-125 can be formed by a deposition process, for example, a low pressure chemical vapor deposition (LPCVD) process.

Figure 2:
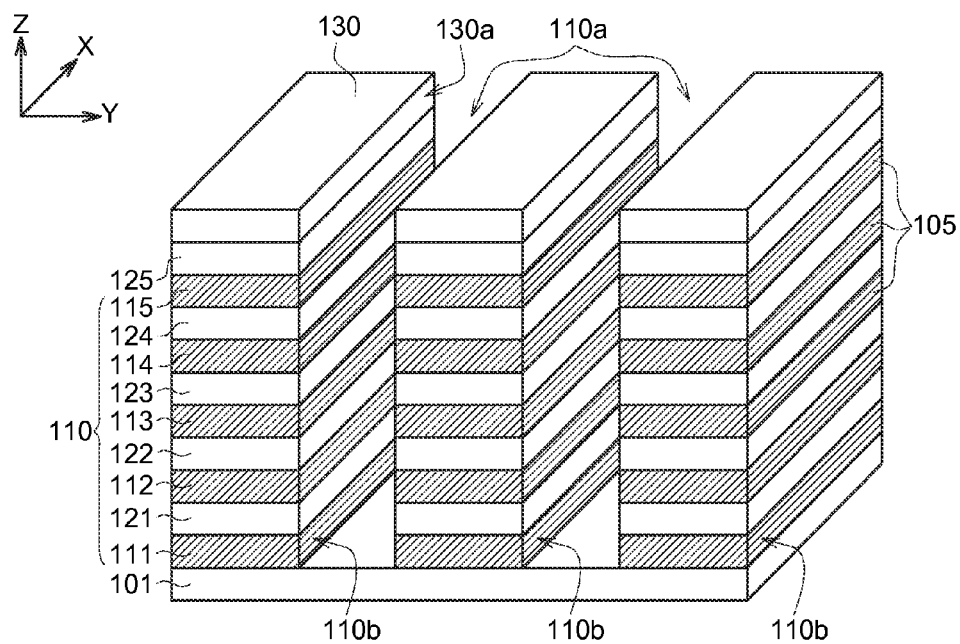
FIG. 2 is a prospective view illustrating the result after the process for patterning the multi-layer stack is performed on the structure depicted in FIG. 1

Next, the multi-layer stack 110 is the patterned to form a plurality of ridge-shaped stacks 110b. FIG. 2 is a prospective view illustrating the result after the process for patterning the multi-layer stack 110 is performed on the structure depicted in FIG. 1. In some embodiments of the present invention, the process for patterning the multi-layer stack 110 comprises steps as follows: A patterned hard mask layer 130 is firstly provided on a top surface of the multi-layer stack 110. In the present embodiment, the patterned hard mask layer 130 is formed on the top surface of the insulating layer 125, and comprises a plurality of trench openings 130a extending along the Z-direction. Each of the trench openings 130a has a long axis extending along an X-direction; and a portion of the top surface of the insulating layer 125 is exposed from the trench openings 130a.

In some embodiments of the present invention, the hard mask layer 130 may be an advanced patterning film (APF) formed by a chemical vapor deposition (CVD) process to deposit the APF over the entire top surface of the multi-layer stack 110. These trench openings 130a are formed by a photolithography process that removes portions of the APF. In the present embodiment, these trench openings 130a are each formed in (but not limited to) a square shape having the same size.

Thereafter, the multi-layer stack 110 is etched by using the patterned hard mask layer 130 as an etching mask, to form a plurality of trenches 110a extending along the Z-direction until regions of substrate 101 is exposed by the trenches 110a, so as to divide the multi-layer stack 110 into a plurality of ridge-shaped stacks 110b. In the present embodiment, each of the ridge-shaped stacks 110b comprises a portion of the conductive layers 111-115 each of which is shaped as a conductive stripe 105 used for connecting the memory cells of the 3D memory device 100 subsequently formed on a corresponding level of the multi-layer stack 110 in series.

Figure 3:
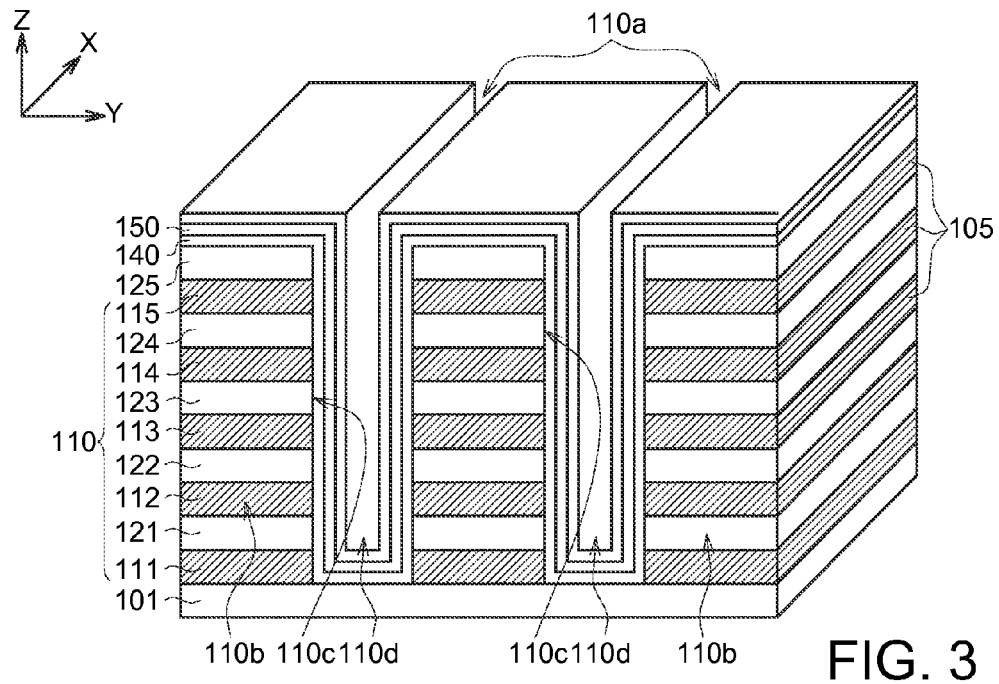
FIG. 3 is a prospective view illustrating the result after a memory material layer and a conductive material are sequentially formed on the structure depicted in FIG. 2.

FIG. 3 is a prospective view illustrating the result after a memory material layer 140 and a channel layer 150 are sequentially formed on the structure depicted in FIG. 2. In some embodiments of the present invention, the memory material layer 140 may be formed of a composite layer (i.e., an ONO layer) including a silicon oxide layer, a silicon nitride layer, and a silicon oxide layer, by a LPCVD process. In the present embodiment, the memory material layer 140 is formed on the top surfaces of the ridge-shaped stacks 110b as well as the sidewalls 110c and the bottoms (i.e., the surface of the substrate that is exposed from the trenches 110a) of the trenches 110a.

After the memory material layer 140 is formed, the channel layer 150 is formed on the ridge-shaped stacks 110b in a manner of blanket over the memory material layer 140 and filling the trenches 110a. In some embodiments of the present invention, the conductive material layer 150 may be formed by a LPCVD process. The channel layer 150 may be formed of an electrically conductive material, such as n+-type poly-silicon (n-type epitaxial single crystal silicon) doped with phosphorus or arsenic, p+-type poly-silicon (p-type epitaxial single crystal silicon) doped with boron or un-doped or intrinsic polysilicon. The channel layer 150 is preferred un-doped or intrinsic polysilicon. Alternatively, the channel layer 150 may be formed of oxide semiconductor, such as InZnO, InGaZnO or the combination thereof. The channel layer 150 could be made of other semiconductor material, such as GaAs, GaN, Ge, SiGex and so on or the arbitrary combinations thereof.

Figure 4A:
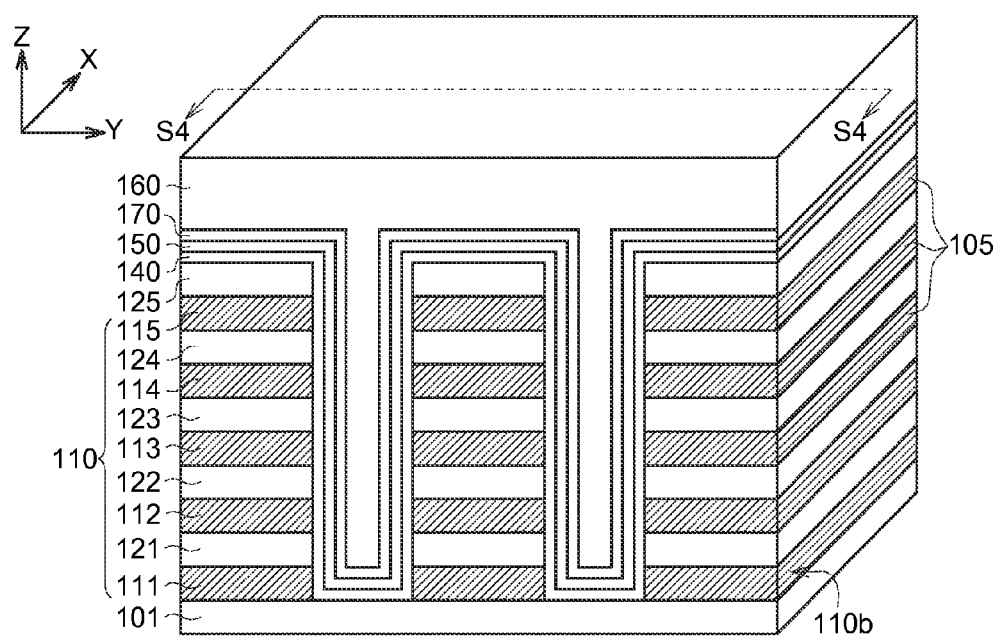
FIG. 4A is prospective view illustrating the result after a sacrifice layer is formed on the structure depicted in FIG. 3.
Figure 4B:
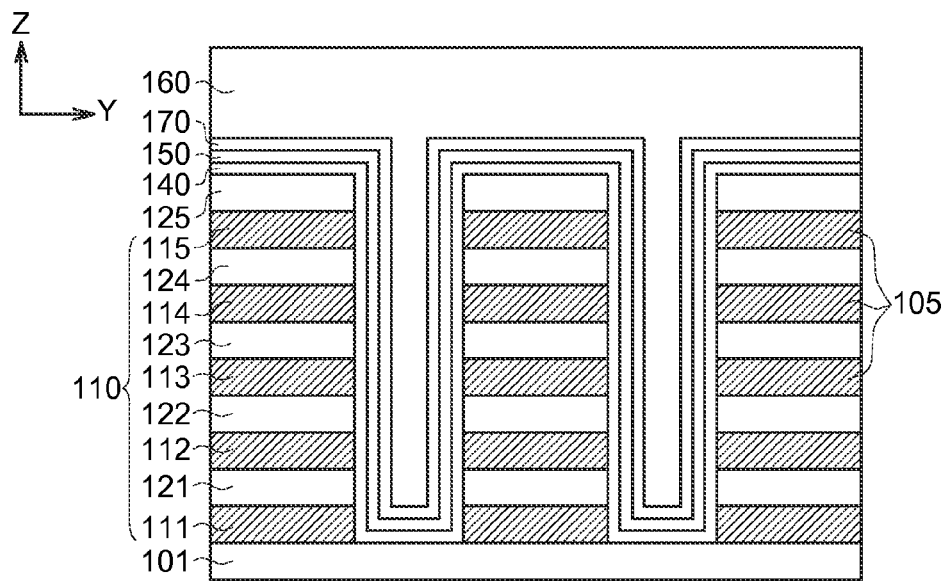
FIG. 4B is a cross-sectional view taken along the line S4 depicted in FIG. 4A.

Subsequently, a sacrifice layer 160 is formed on the channel layer 150 and fulfills the trenches 110a. FIG. 4A is prospective view illustrating the result after the sacrifice layer 160 is formed on the structure depicted in FIG. 3; FIG. 4B is a cross-sectional view taken along the line S4 depicted in FIG. 4A. In some embodiments of the present invention, the sacrifice layer 160 may be made of semiconductor material, such as germanium (Ge), silicon germanium (SiGe) or other suitable semiconductor material. The sacrifice layer 160 can be formed by a deposition process. In some other embodiments of the present invention, the sacrifice layer 160 may be made of thermal degradable polymer (TDP), such as diacrylate, dimethacrylate or the combination thereof. In yet other embodiments of the present invention, the sacrifice layer 160 may be made of photo-resist material. In addition, the sacrifice layer 160 may also be made of diamond-Like carbon (DLC) film, organic dielectric Layer (ODL), APF or films made of Kodiak or Topaz provided by Applied Materials, Inc. (AMAT).

In some embodiments of the present invention, a dielectric insulating layer 170 may be optionally formed on the channel layer 150 prior to the forming of the sacrifice layer 160 (see FIGS. 4A and 4B). For example, in one embodiment of the present invention, the dielectric insulating layer 170 can be formed by a thermal oxidation process conducted on a surface of the channel layer 150. In another embodiment of the present invention, the dielectric insulating layer 170 can be made of various dielectric materials formed by a LPCVD process.

Figure 5:
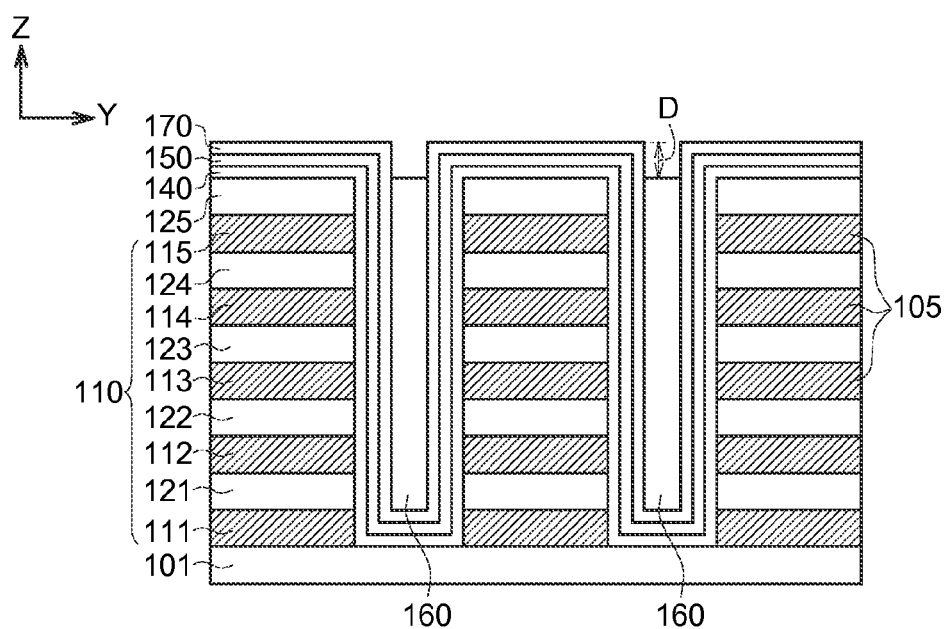
FIG. 5 is a cross-sectional view illustrating the result after a planarization process and a etch back process are performed on the structure depicted in FIG. 4B.

After the sacrifice layer 160 is formed, a planarization process, such as a chemical mechanical polishing (CMP), using the dielectric insulating layer 170 as a stop layer is performed to remove the sacrifice layer 160 except the portion thereof disposed in the trenches 110a. An etch back process is then performed to make the top surface of the remained sacrifice layer 160 that is disposed in the trenches 110a separated from the opening portion of the trenches 110a by a distance D. See FIG. 5, FIG. 5 is a cross-sectional view illustrating the result after a planarization process and the etch back process are performed on the structure depicted in FIG. 4B.

Subsequently, portions of the memory layer 140, the channel layer 150 and the sacrifice layer 160 that are disposed in the trenches 110a are removed to form a plurality of opening 180 to expose a portion of the substrate 101, whereby a plurality of memory cells 106 are defined on the sidewalls 110c of the trenches 110a. In the present embodiment, each of the memory cells 106 is comprises one of the conductive stripe 105 involved in the ridge-shaped stacks 110b and portions of the memory layer 140 and the channel layer 150 inter intersect with the conductive stripe 105.

Figure 6A:
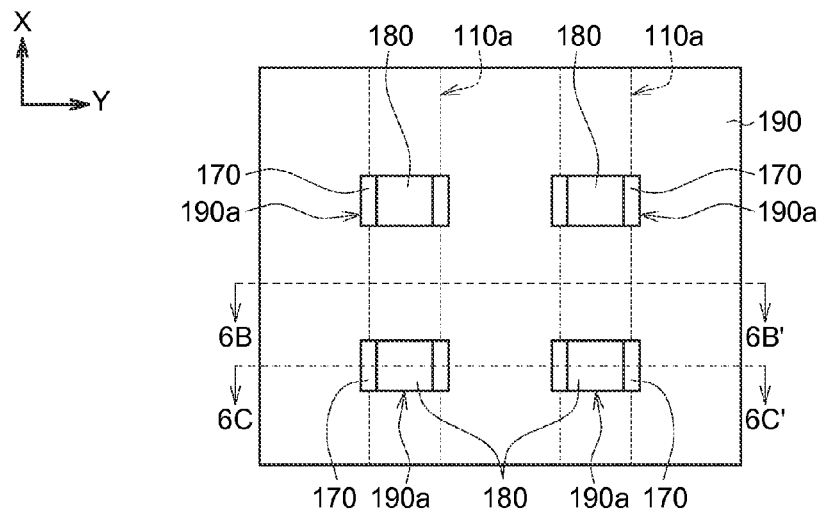
FIG. 6A is a top view illustrating the result after a patterned hard mask layer is formed on the structure depicted in FIG. 5.
Figure 6B:
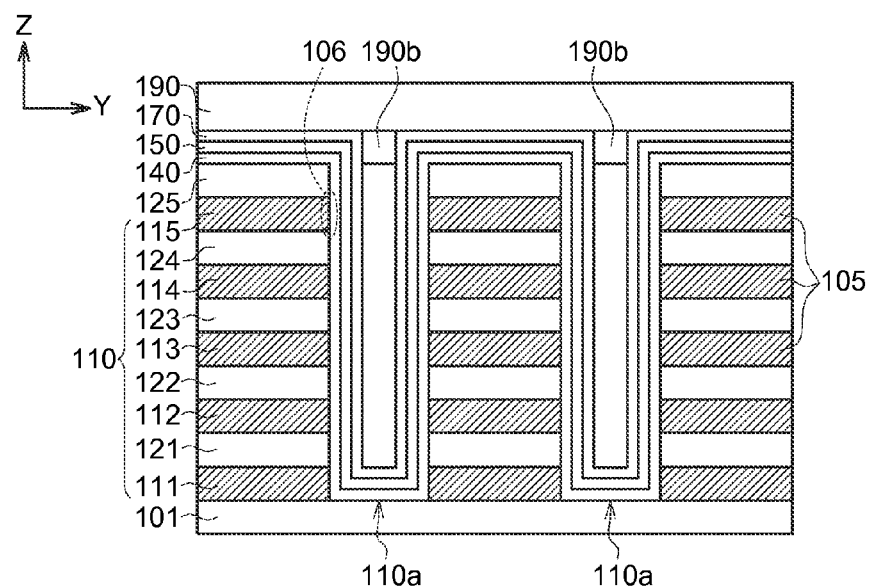
FIG. 6B is a cross-section view taken along with the line 6B-6B' depicted in FIG. 6A.
Figure 6C:
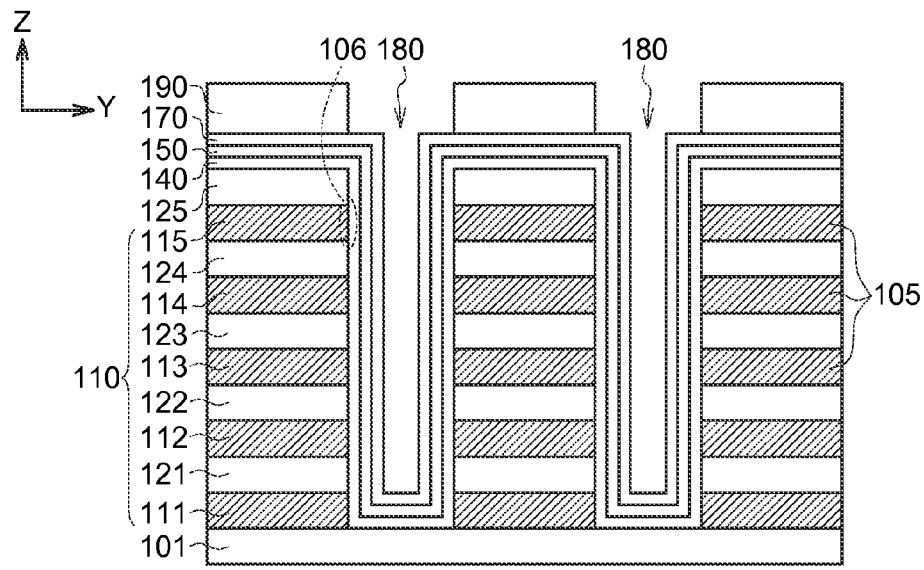
FIG. 6C is a cross-section view taken along with the line 6C-6C' depicted in FIG. 6A.

In some embodiments of the present invention, the forming of the opening comprises steps as follows: Firstly, a patterned hard mask layer 190 is formed on the ridge-shaped stacks 110b and the sacrifice layer 160. FIG. 6A is a top view illustrating the result after the patterned hard mask layer 190 is formed on the structure depicted in FIG. 5; FIG. 6B is a cross-section view taken along with the line 6B-6B' depicted in FIG. 6A; and FIG. 6C is a cross-section view taken along with the line 6C-6C' depicted in FIG. 6A. Wherein, the patterned hard mask layer 190 has a plurality of patterned opening 190a used to expose portions of the sacrifice layer 160 and the dielectric insulating layer 170 (or the channel layer 150, if the dielectric insulating layer 170 is not provided); and each of the patterned hard mask layer 190 further comprises an extending portion 190b extending into a corresponding trench 110a and in contact with the top surface of the sacrifice layer 160 and the upper portion of the insulating layer 170 disposed in adjacent to the opening portion of the trench 110a.

Figure 7A:
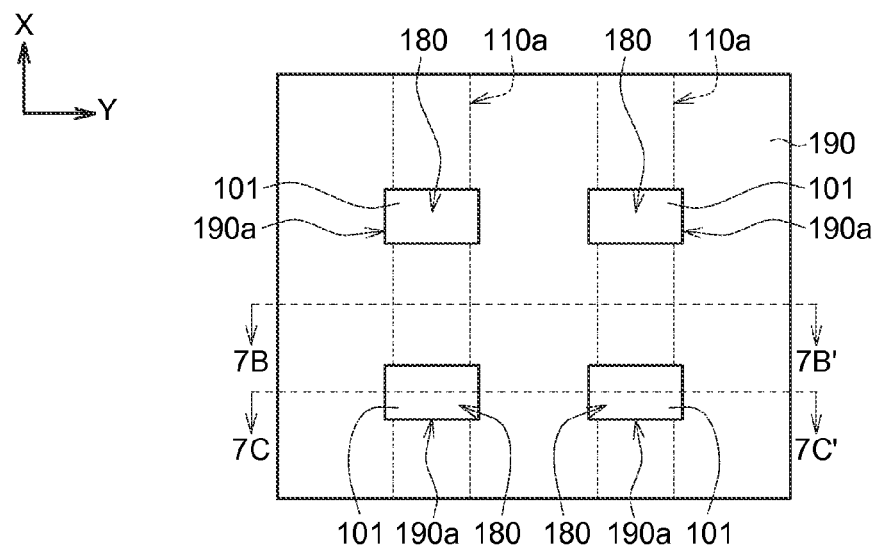
FIG. 7A is a top view illustrating the result after an etching process is performed on the structure depicted in FIG. 6A.
Figure 7B:
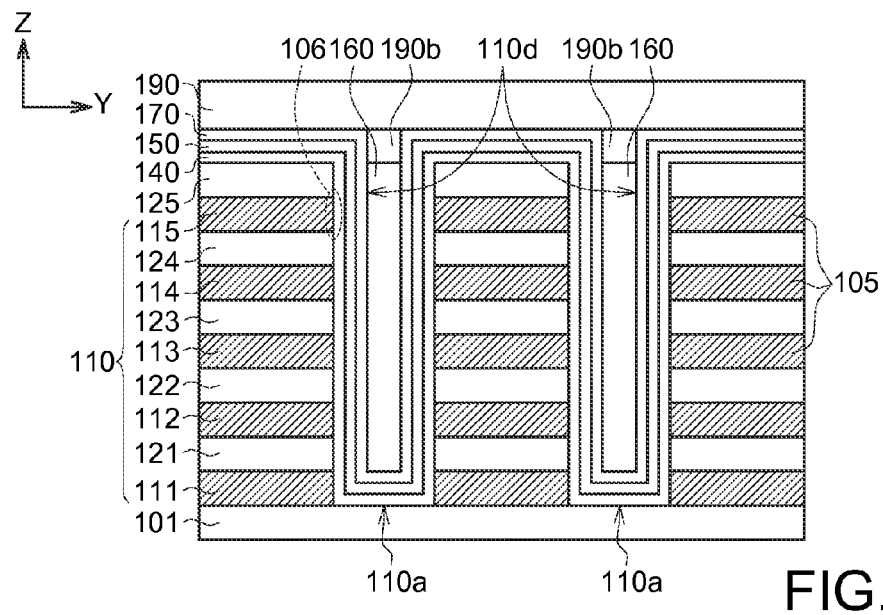
FIG. 7B is a cross-section view taken along with the line 7B-7B' depicted in FIG. 7A.
Figure 7C:
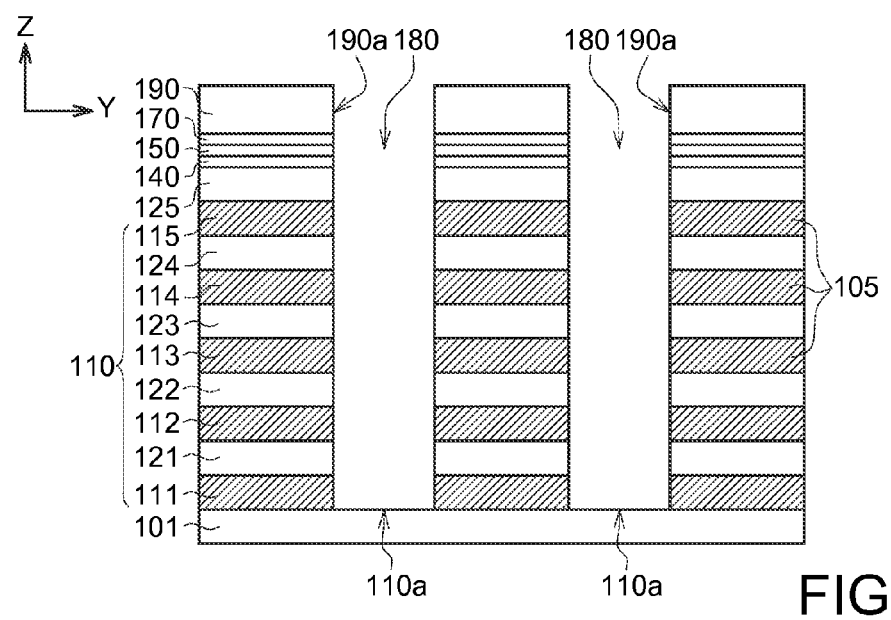
FIG. 7C is a cross-section view taken along with the line 7C-7C' depicted in FIG. 7A.

An etching process using the patterned hard mask layer 190 as an etching mask is then performed to remove portions of the memory layer 140, the channel layer 150 and the sacrifice layer 160 that are disposed in the trenches 110a, so as to form a plurality of opening 180 to expose a portion of the substrate 101. In some embodiments of the present invention, the opening 180 are formed by a dry etching process. FIG. 7A is a top view illustrating the result after an etching process is performed on the structure depicted in FIG. 6A; FIG. 7B is a cross-section view taken along with the line 7B-7B'depicted in FIG. 7A; and FIG. 7C is a cross-section view taken along with the line 7C-7C' depicted in FIG. 7A. Since the gaps 110d formed in the trenches 110a are fulfilled by the sacrifice layer 160, thus the etching gas used to form the opening 180 cannot flow along the gaps 110d and damage the memory layer 140 and the channel layer 150 used to form the memory cells 106.

Figure 8A:
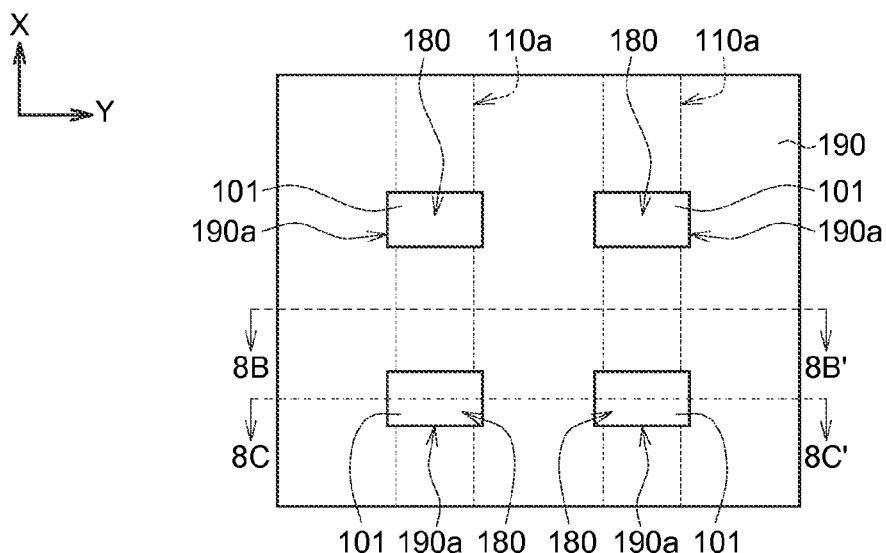
FIG. 8A is a top view illustrating the result after the remaining sacrifice layer are removed from the structure depicted in FIG. 7A.
Figure 8B:
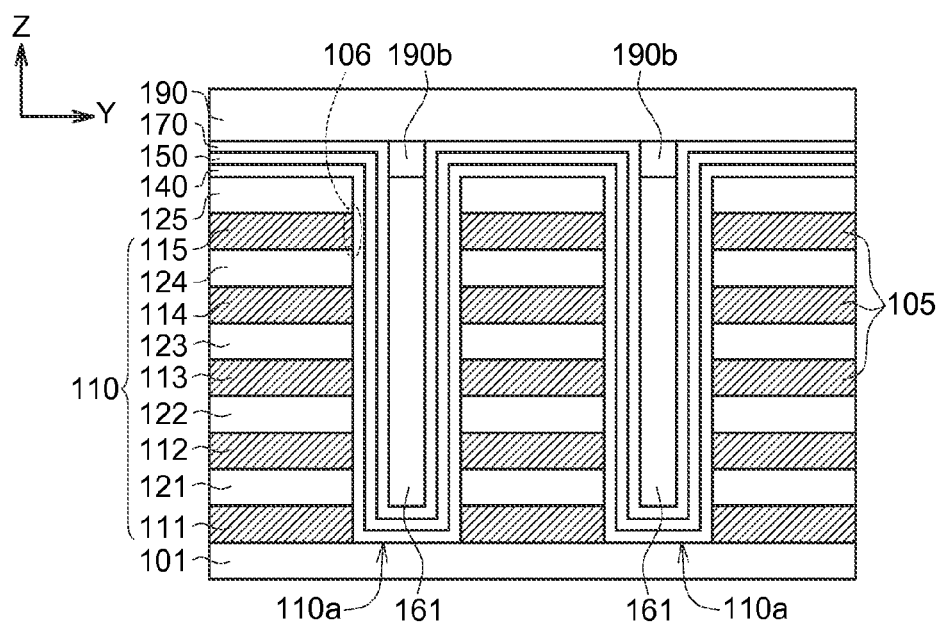
FIG. 8B is a cross-section view taken along with the line 8B-8B' depicted in FIG. 8A.
Figure 8C:
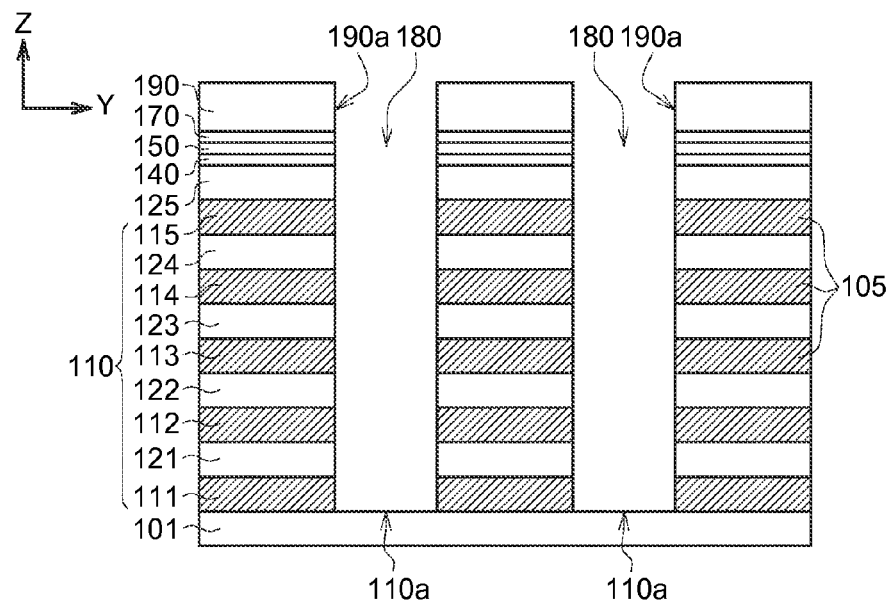
FIG. 8C is a prospective view taken along with the line 8C-8C'depicted in FIG. 8A.

Thereafter, the remaining sacrifice layer 160 is removed through the opening 180 to define a plurality of air gaps 161 in the trenches 110a. FIG. 8A is a top view illustrating the result after the remaining sacrifice layer are removed from the structure depicted in FIG. 7A; FIG. 8B is a cross-section view taken along with the line 8B-8B' depicted in FIG. 8A; and FIG. 8C is a prospective view taken along with the line 8C-8C'depicted in FIG. 8A.

In the embodiments of the present invention, the ways for removing the remaining sacrifice layer 160 may vary depend upon the material constituting thereof. For example, in some embodiments of the present invention, the remaining sacrifice layer 160 may be removed by an isotropic etching process using fluorine-containing etchant, such as hydrofluoric acid (HF) through the opening 180, when the sacrifice layer 160 is made of semiconductor material, such as Ge or SiGe. In some other embodiments of the present invention, the remaining sacrifice layer 160 may be removed through the opening 180 by a thermal removing process, when the sacrifice layer 160 is made of TDP, such as diacrylate, dimethacrylate or the combination thereof. In yet other embodiments of the present invention, the remaining sacrifice layer 160 may be removed through the opening 180 by a photo-resist peeling process with an oxygen-containing atmosphere, laser irradiation or other suitable processes, when the sacrifice layer 160 is composed by a photo-resist layer, a DLC film, an ODL, a APF, Kodiak film, Topaz film or the arbitrary combinations thereof.

Figure 9A:
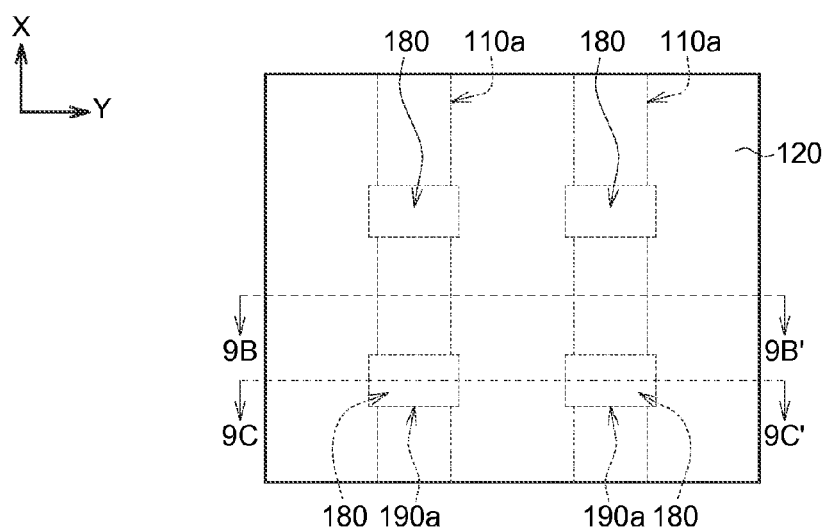
FIG. 9A is a cross sectional view illustrating the result after the un-conformal silicon oxide layer is formed on the structure depicted in FIG. 8A.
Figure 9B:
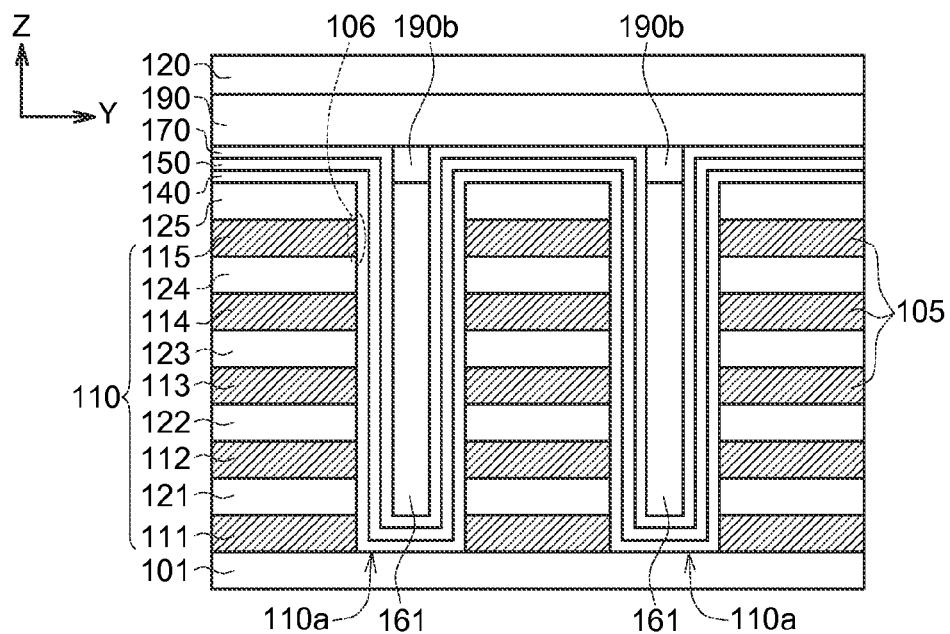
FIG. 9B is a cross-section view taken along with the line 9B-9B' depicted in FIG. 9A.
Figure 9C:
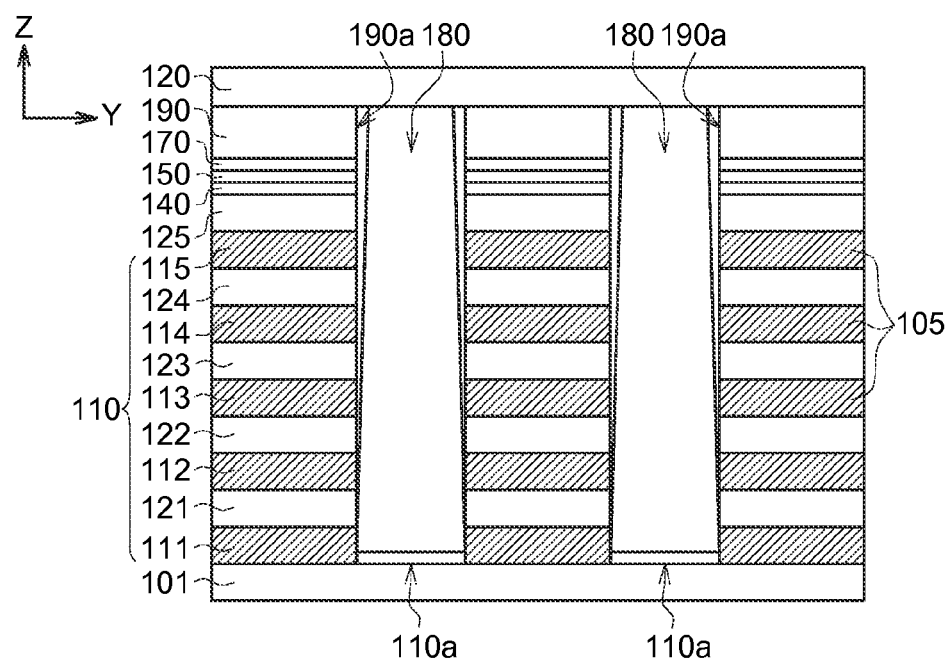
FIG. 9C is a prospective view taken along with the line 9C-9C' depicted in FIG. 9A.

Anther deposition process, such as another LPCVD, is then performed to form an un-conformal silicon oxide layer 120 covering on the patterned hard mask layer 190, in a manner of sealing the opening 180 and partially coating on the bottoms and the sidewalls of the trenches 110a. FIG. 9 A is a cross sectional view illustrating the result after the un-conformal silicon oxide layer 120 is formed on the structure depicted in FIG. 8A; FIG. 9B is a cross-section view taken along with the line 9B-9B' depicted in FIG. 9A; and FIG. 9C is a prospective view taken along with the line 9C-9C' depicted in FIG. 9A.

However, it should be appreciated that the process for forming the un-conformal silicon oxide layer 120 may be optional, and in some embodiments of the present invention, the un-conformal silicon oxide layer 120 may be substituted by an un-conformal dielectric layer with low dielectric constant (an un-conformal low-k layer).

Figure 10A:
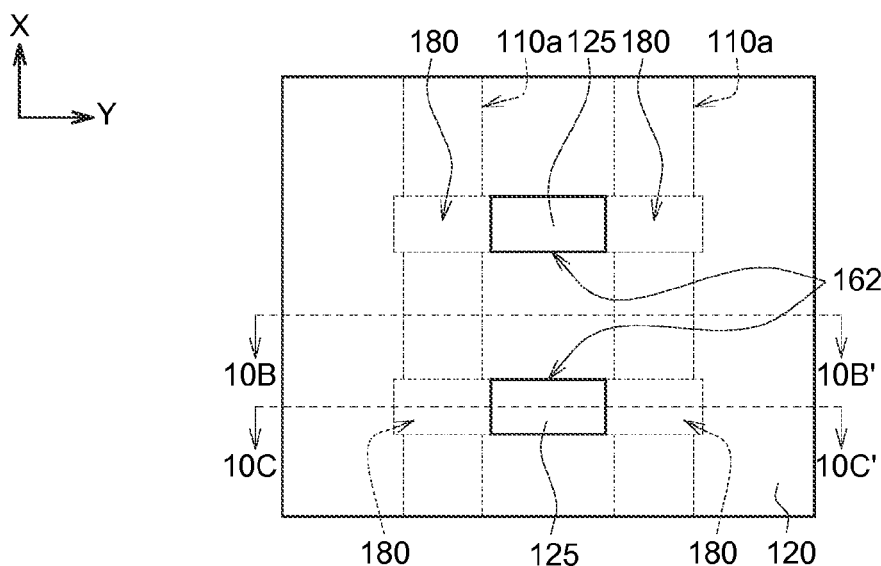
FIG. 10A is a cross sectional view illustrating the result after a patterning process is performed on the structure depicted in FIG. 9A.
Figure 10B:
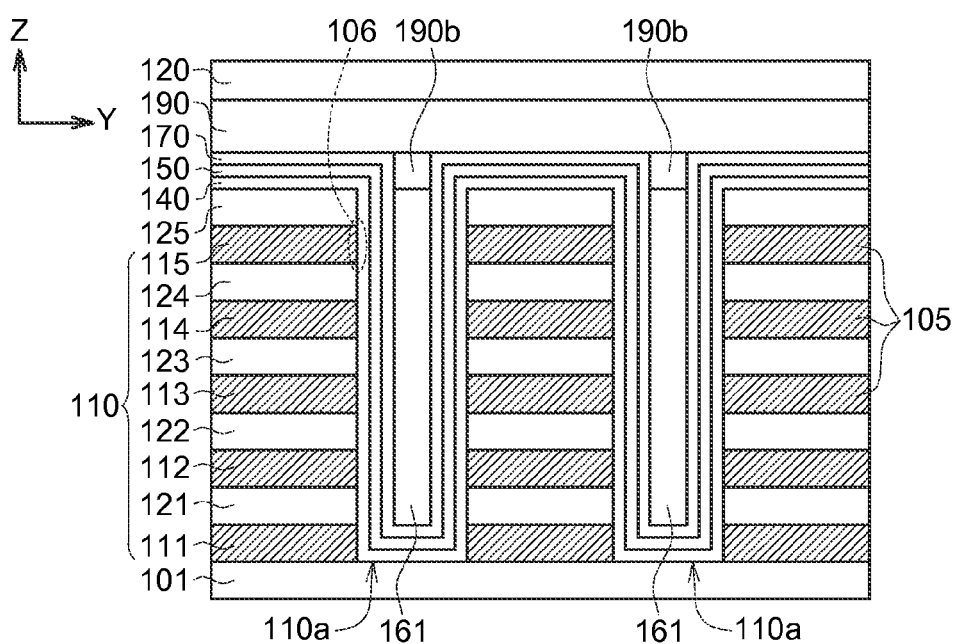
FIG. 10B is a cross-section view taken along with the line 10B-10B' depicted in FIG. 10A.
Figure 10C:
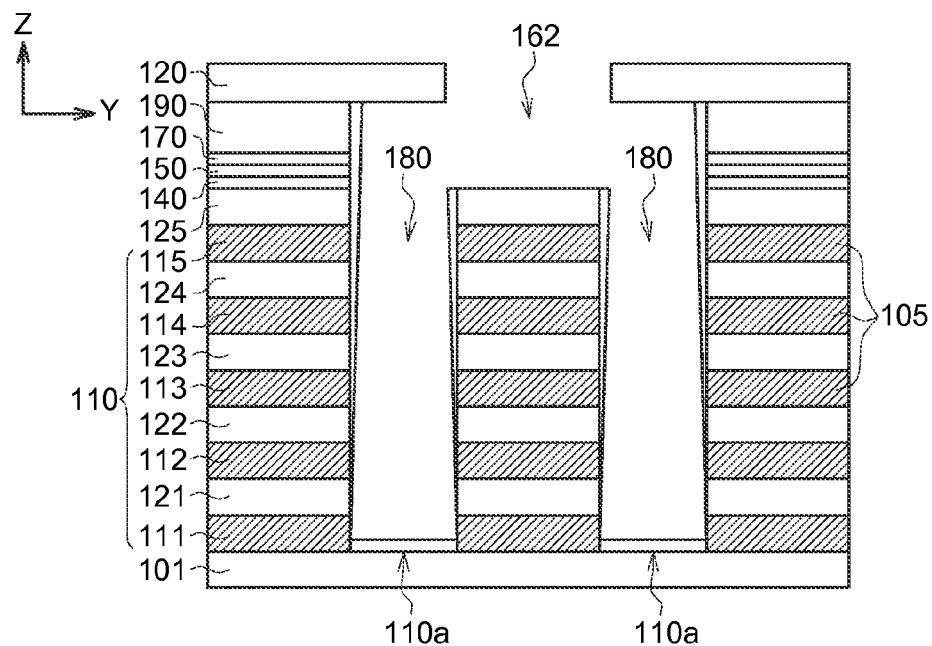
FIG. 10C is a prospective view taken along with the line 10C-10C' depicted in FIG. 10A.

Next, another patterning process is performed to remove portions of the memory layer 140 and the channel layer 150 disposed on the ridge-shaped stacks 110b in order to make an interconnection 162 interconnecting two adjacent trenches 110a through two of the openings 180 formed in the two adjacent trenches 110a. FIG. 10A is a cross sectional view illustrating the result after the patterning process is performed on the structure depicted in FIG. 9A; FIG. 10B is a cross-section view taken along with the line 10B-10B' depicted in FIG. 10A; and FIG. 10C is a prospective view taken along with the line 10C-10C' depicted in FIG. 10A.

In the present embodiment, patterning process may be a lithography-etching used to remove portions of the patterned hard mask layer 190, the dielectric insulating layer 170, the memory layer 140 and the channel layer 150 disposed on the ridge-shaped stacks 110b, so as to form the interconnection 162 interconnecting the two adjacent trenches 110a through two of the openings 180 that are formed in the two adjacent trenches 110a.

Figure 11A:
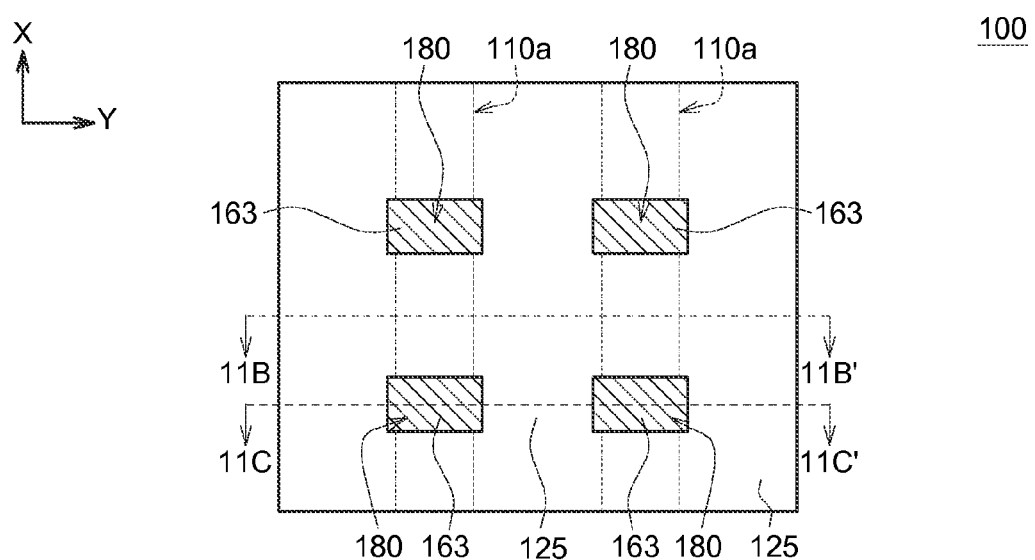
FIG. 11A is a cross sectional view illustrating the result after another planarization process is performed on the structure depicted in FIG. 9A.
Figure 11B:
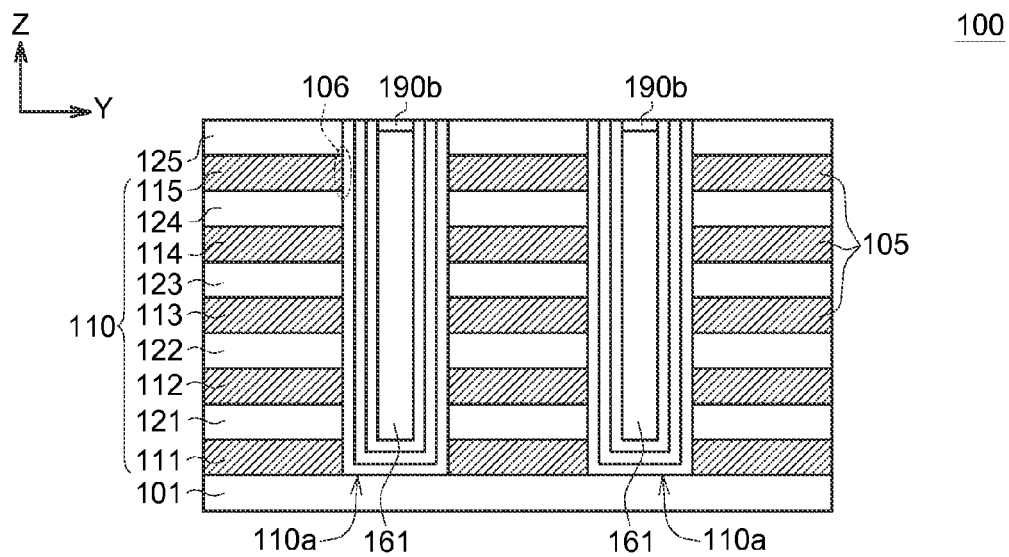
FIG. 11B is a cross-section view taken along with the line 11B-11B' depicted in FIG. 11A.
Figure 11C:
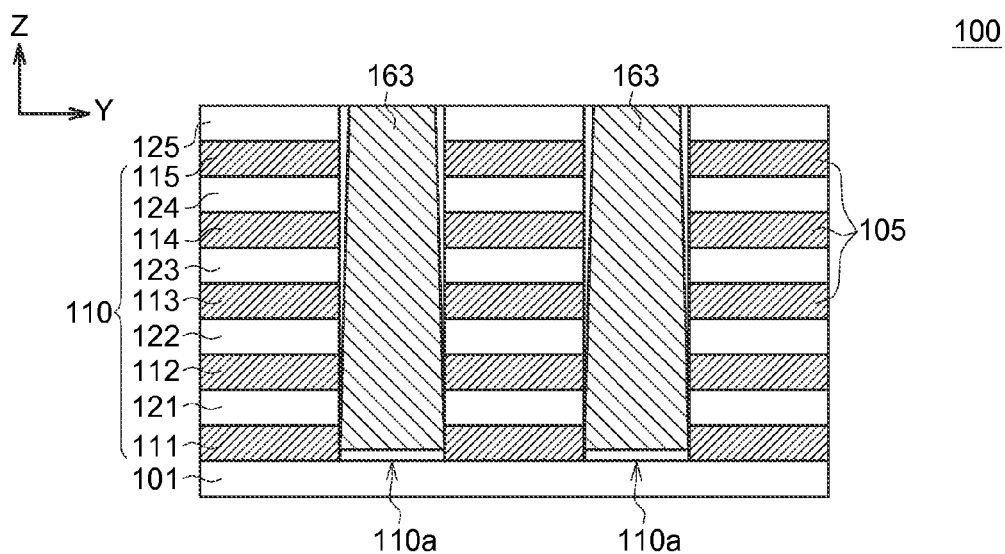
FIG. 11C is a prospective view taken along with the line 11C-11C' depicted in FIG. 11A.

Subsequently, an interlayer dielectric (ILD) layer 163 is formed on the silicon oxide layer 120 and fulfills the interconnection 162; and another planarization process is performed FIG. 11A is a cross sectional view illustrating the result after the yet another planarization process is performed on the structure depicted in FIG. 10A; FIG. 11B is a cross-section view taken along with the line 11B-11B' depicted in FIG. 11A; and FIG. 11C is a prospective view taken along with the line 11C-11C' depicted in FIG. 11A.

In the present embodiment, the planarization process may remove the portions of the dielectric insulating layer 170, the memory layer 140 and the channel layer 150 disposed on the ridge-shaped stacks 110b; and merely a portion of the extending portions 190b of the patterned hard mask layer 190 are remained. However, it is not limited, the stop layer of the planarization process may be determined depending on the process need. In some embodiments of the present invention, the planarization process, such as a CMP process, may stopped on the insulating layer 125, or the patterned hard mask layer 190, or the un-conformal silicon oxide layer 120 or remaining some of the ILD layer 163 that disposed on the patterned hard mask layer 190. After series downstream processes (not shown) are carried out the 3D memory device 100 is completed.

In accordance with the aforementioned embodiments of the present invention, a method for fabricating a memory device is provided. Plural of trenches are formed in a multi-layers stack to define a plurality of ridge-shaped stacks each of which comprises at least one conductive strip. A memory layer and a channel layer are formed sequentially on bottoms and sidewalls of the trenches, and a sacrifice layer is then formed to fulfill the gaps formed in the trenches. Portions of the memory layer and the channel layer that are disposed in the trenches are removed to form a plurality of openings in the trench and define a plurality of memory cells connected in series and disposed on the vertical sidewalls of the trenches. Since the gaps formed in the trenches are fulfilled by the sacrifice layer prior the forming of the openings, thus the etching gas used to form the opening cannot flow along the gaps and damage the portions of the memory layer and the channel layer that are disposed in the trenches. As a result, the prior art problems of misaligned bit line openings and device failure of the 3D SGVC flash memory due to the damages of the memory layer and the channel layer caused by overflow of the etching gas may be avoided.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a memory device, comprising:
   forming a multi-layer stack on a substrate;
   patterning the multi-layer stack to form a plurality of trenches extending along a first direction, so as to define a plurality of ridge-shaped stacks each of which comprises at least one conductive strip;
   forming a memory layer and a channel layer in sequence on bottoms and sidewalls of the trenches;
   forming a sacrifice layer to fulfill the trenches;
   removing portions of the sacrifice layer, the memory layer and the channel layer formed in the trenches to form a plurality of openings and exposing a portion of the substrate therefrom, wherein the process for forming the plurality of openings comprises:
   forming a patterned hard mask layer on the ridge-shaped stacks and the sacrifice layer; wherein the patterned hard mask layer has a plurality of patterned opening used to expose portions of the sacrifice layer and the channel; and
   performing an etching process to remove portions of the memory layer, the channel layer and the sacrifice layer that are not covered by the patterned hard mask layer;
   removing the remaining sacrifice layer to form a plurality of air gaps in the trenches;
   performing a deposition process to form an silicon oxide layer covering the openings and the patterned hard mask layer; and
   patterning portions of the memory layer and the channel layer disposed on the ridge-shaped stacks to form an interconnection interconnecting two adjacent trenches through two of the openings formed in the two adjacent trenches.

2. The method according to claim 1, prior to the process for forming the patterned hard mask layer further comprising:
   performing a planarization process to remove the sacrifice layer except the portion thereof disposed in the trenches;
   performing an etch back process to remove portions of the sacrifice layer that are disposed in the trenches.

3. The method according to claim 2, wherein the patterned hard mask layer comprises a plurality of extending portions extending into a corresponding trench.

4. The method according to claim 1, after the interconnection is formed further comprising:
   forming an interlayer dielectric (ILD) layer to fulfill the interconnection; and
   performing a planarization process to remove portions of the memory layer and the channel layer disposed on the ridge-shaped stacks.

5. The method according to claim 1, prior to the process for forming the sacrifice layer further comprising steps of forming a dielectric insulating layer on the channel layer.

6. The method according to claim 1, wherein the sacrifice layer comprises semiconductor material; and the remaining sacrifice layer are removed by an isotropic etching process.

7. The method according to claim 6, wherein the semiconductor material comprises germanium (Ge) or silicon germanium (SiGe).

8. The method according to claim 1, wherein the sacrifice layer comprises thermal degradable polymer (TDP); and the remaining sacrifice layer are removed by a thermal removing process.

9. The method according to claim 8, wherein the TDP comprises diacrylate, dimethacrylate or the combination thereof.

10. The method according to claim 1, wherein the sacrifice layer comprises photo-resist material; and the remaining sacrifice layer are removed by a photo-resist peeling process.

11. The method according to claim 10 wherein the photo-resist peeling process comprises steps of removing the photo-resist material within an oxygen-containing atmosphere.

* * * * *